(12) United States Patent
Kobrin

(10) Patent No.: US 9,645,504 B2
(45) Date of Patent: *May 9, 2017

(54) LARGE AREA NANOPATTERNING METHOD AND APPARATUS

(75) Inventor: Boris Kobrin, Dublin, CA (US)

(73) Assignee: METAMATERIAL TECHNOLOGIES USA, INC., Pleasanton, CA (US)

(*) Notice: Subject to any disclaimer, the term of this patent is extended or adjusted under 35 U.S.C. 154(b) by 698 days.

This patent is subject to a terminal disclaimer.

(21) Appl. No.: 13/416,716

(22) Filed: Mar. 9, 2012

(65) Prior Publication Data

US 2012/0162629 A1    Jun. 28, 2012

Related U.S. Application Data

(60) Division of application No. 12/384,219, filed on Apr. 1, 2009, now Pat. No. 8,518,633, which is a
(Continued)

(51) Int. Cl.
*G03F 1/26* (2012.01)
*G03F 1/92* (2012.01)
(Continued)

(52) U.S. Cl.
CPC ............ *G03F 7/703* (2013.01); *G03B 27/42* (2013.01); *G03F 7/704* (2013.01); *G03F 7/7035* (2013.01);
(Continued)

(58) Field of Classification Search
None
See application file for complete search history.

(56) References Cited

U.S. PATENT DOCUMENTS 4,888,266 A * 12/1989 Lacotte et al. ............... 430/141
5,634,606 A *  6/1997 Roder .......................... 242/555.3
(Continued)

FOREIGN PATENT DOCUMENTS

AU   2005213499   8/2005
CA   2558623      8/2005
(Continued)

OTHER PUBLICATIONS

Han et al., "Fabrication of complex nanostructures on various substrates", Appl. Phys. Lett., vol. 91 pp. 123118-1 to 123118-3 (Sep. 2007).*
(Continued)

*Primary Examiner* — Martin Angebranndt
(74) *Attorney, Agent, or Firm* — Joshua D. Isenberg; JDI Patent

(57) ABSTRACT

Embodiments of the invention relate to methods and apparatus useful in the nanopatterning of large area substrates, where a rotatable mask is used to image a radiation-sensitive material. Typically the rotatable mask comprises a cylinder. The nanopatterning technique makes use of Near-Field photolithography, where the mask used to pattern the substrate is in contact or close proximity with the substrate. The Near-Field photolithography may make use of an elastomeric phase-shifting mask, or may employ surface plasmon technology, where a rotating cylinder surface comprises metal nano holes or nanoparticles.

8 Claims, 5 Drawing Sheets

Related U.S. Application Data continuation of application No. PCT/US2008/012901, filed on Nov. 18, 2008.

(60) Provisional application No. 61/011,861, filed on Jan. 22, 2008.

(51) Int. Cl.
*G03F 7/20* (2006.01)
*G03F 7/22* (2006.01)
*G03B 27/42* (2006.01)

(52) U.S. Cl.
CPC ...... *G03F 7/70325* (2013.01); *G03F 7/70358* (2013.01)

(56) References Cited

U.S. PATENT DOCUMENTS

| | | | |
|---|---|---|---|
| 5,725,788 A | 3/1998 | Maracas et al. | |
| 5,925,259 A | 7/1999 | Biebuyck et al. | |
| 5,928,815 A | 7/1999 | Martin | |
| 6,045,980 A * | 4/2000 | Edelkind et al. | 430/320 |
| 6,060,143 A * | 5/2000 | Tompkin et al. | 428/64.1 |
| 6,171,730 B1 * | 1/2001 | Kuroda et al. | 430/5 |
| 6,236,033 B1 * | 5/2001 | Ebbesen et al. | 250/216 |
| 6,272,275 B1 * | 8/2001 | Cortright et al. | 385/129 |
| 6,274,294 B1 | 8/2001 | Hines | |
| 6,444,254 B1 | 9/2002 | Chilkoti et al. | |
| 6,518,168 B1 | 2/2003 | Clem et al. | |
| 6,569,575 B1 * | 5/2003 | Biebuyck et al. | 430/5 |
| 6,753,131 B1 | 6/2004 | Rogers et al. | |
| 6,770,416 B2 | 8/2004 | Figov | |
| 6,808,646 B1 | 10/2004 | Jeans | |
| 7,144,539 B2 | 12/2006 | Olsson | |
| 7,170,666 B2 | 1/2007 | Piehl et al. | |
| 7,208,788 B2 | 4/2007 | Hiroshima | |
| 7,312,939 B2 | 12/2007 | Bandic et al. | |
| 7,476,523 B2 | 1/2009 | Schueller et al. | |
| 7,567,774 B2 | 7/2009 | Yanagihara | |
| 7,601,394 B2 | 10/2009 | Gorman et al. | |
| 7,682,540 B2 | 3/2010 | Boyan et al. | |
| 8,182,982 B2 * | 5/2012 | Kobrin | 430/322 |
| 8,192,920 B2 * | 6/2012 | Kobrin | 430/322 |
| 8,318,386 B2 * | 11/2012 | Kobrin | 430/2 |
| 8,334,217 B2 * | 12/2012 | Kobrin | 438/758 |
| 2003/0129385 A1 * | 7/2003 | Hojo et al. | 428/323 |
| 2003/0129545 A1 | 7/2003 | Kik | |
| 2004/0163758 A1 | 8/2004 | Kagan et al. | |
| 2004/0219246 A1 * | 11/2004 | Jeans | 425/174.4 |
| 2004/0224256 A1 | 11/2004 | Figov | |
| 2004/0257629 A1 | 12/2004 | Noehte et al. | |
| 2005/0196452 A1 | 9/2005 | Boyan | |
| 2005/0202185 A1 | 9/2005 | Greengarde et al. | |
| 2005/0224452 A1 | 10/2005 | Spiess et al. | |
| 2006/0014108 A1 | 1/2006 | Ito et al. | |
| 2006/0033896 A1 * | 2/2006 | Kiriya | 355/53 |
| 2006/0072295 A1 | 4/2006 | Goetzen | |
| 2006/0246169 A1 * | 11/2006 | Chen et al. | 425/385 |
| 2007/0119048 A1 | 5/2007 | Li et al. | |
| 2007/0138699 A1 | 6/2007 | Wuister et al. | |
| 2007/0172746 A1 | 7/2007 | Hiroshima | |
| 2007/0200276 A1 | 8/2007 | Mackey et al. | |
| 2008/0056768 A1 | 3/2008 | Yanagihara | |
| 2009/0136679 A1 | 5/2009 | Boukaftane et al. | |
| 2009/0170014 A1 | 7/2009 | Shibazaki | |
| 2009/0269705 A1 | 10/2009 | Kobrin | |
| 2009/0297989 A1 | 12/2009 | Kobrin | |
| 2009/0305513 A1 | 12/2009 | Kobrin | |
| 2010/0018421 A1 | 1/2010 | Pan et al. | |
| 2010/0035163 A1 | 2/2010 | Kobrin | |
| 2010/0123885 A1 | 5/2010 | Kobrin | |
| 2010/0173494 A1 | 7/2010 | Kobrin | |
| 2011/0024950 A1 | 2/2011 | Kruglick | |
| 2011/0210480 A1 * | 9/2011 | Kobrin | 264/447 |
| 2012/0224159 A1 * | 9/2012 | Kobrin | 355/53 |
| 2012/0274004 A1 * | 11/2012 | Kobrin | 264/496 |
| 2012/0282554 A1 * | 11/2012 | Kobrin et al. | 430/326 |

FOREIGN PATENT DOCUMENTS

| | | |
|---|---|---|
| CN | 1735965 | 2/2006 |
| CN | 1943013 | 4/2007 |
| DE | 10233399 | 2/2003 |
| EP | 1786485 | 5/2007 |
| GB | 2395799 | 6/2004 |
| JP | 59200419 | 11/1984 |
| JP | 59200419 A | 11/1984 |
| JP | 3043185 | 2/1991 |
| JP | 8288195 | 11/1996 |
| JP | 2001220159 | 1/2001 |
| JP | 2002072497 | 3/2002 |
| JP | 2005043777 | 2/2005 |
| JP | 2005-085965 * | 3/2005 |
| JP | 2006315033 | 11/2006 |
| JP | 2008126370 | 6/2008 |
| WO | 0046641 | 8/2000 |
| WO | 03001869 | 1/2003 |
| WO | 03012549 | 2/2003 |
| WO | 2005077013 | 8/2005 |
| WO | 2006/043244 * | 4/2006 |
| WO | 2008062634 | 5/2008 |
| WO | 2009094009 | 7/2009 |

OTHER PUBLICATIONS

Jackson et al., "electronics produced by roll to roll self aligned imprint lithography" IEEE/LEOS Summer topical meeting pp. 125-126 (Jul. 2007).*

Maltabes et al., "Moving roll to roll processing from the lab to manufacturing" powerpoint presentation (2006) (42 pages).*

Martin et al., "Energy Flow in light-coupling masks for lensless optical lithography", Opt. Expr., vol. 3(7) pp. 280-285.*

Schmid et al. "Light-coupling masks for lensless, sub-wavelength optical lithography", Appl. { Phys, Lett., vol. 72(19) pp. 2379-2381 (May 1998).*

Paulus et al., "Contrast mechanisms in high resoltuion contact lithography" A comparative study, Microelectron. Eng., vol. 57-58 pp. 109-116 (2001).*

Y Xia; Soft Lithography, Annu.Rev.Mater.Sci, 1998, V.28, p. 153-184.

Yang, Yong; Nanolithography in Evanescent Near Field by Using Nano-Filmed Noble Metals Layers, SPIE, Dec. 1, 2007, China.

Yasuhisa Inao, Near-field lithogrpahy as prototype nano-fabrication tool, MNE-06 Micro- and Nano-Engineering, 2C-6, Photon Lithography.

Yasuhisa Inao, Near-field lithography as prototype nano-fabrication tool, Science Direct, Microelectronic Engineering 84 (2007) pp. 705-710.

Younan Xia, Soft Lithography, Annual Rev. Mater ScL, v.28, p. 153-84, 1998.

Zhaoning Yu; Fabrication of Large Area Subwavelength Antireflection Structures on Si Using Trilayer Resist Nanoimprint Lithography and Liftoff, J.Va.Sci.Techn B21(6).

Notice of Allowance mailed date Aug. 13, 2012 for U.S. Appl. No. 12/384,219, filed Apr. 1, 2009.

Blaber, M.G.; Plasmon Absorption in Nanospheres: A Comparsion of Sodium, Potassium, Aluminium, Silver and Gold, Elsevier, May 15, 2007, Australia.

Brolo, A.G.; The Development of Surface-Plasmon Sensors Using Arrays of Sub-Wavelength Holes, Proceedings of SPIE, the International Society for Optical Engineering, 2005, USA.

Bruce McLeaod; Thin-Films-Motheye Surfaces Reflect Little Light, Lase Focus World, Diplay Article, (36357).

Srituravanich, W,; Sub-100 NM Lithography Using Ultrashort Wavelength of Surface Plasmons, American Institute of Physics Inc., Dec. 1, 2004, USA.

Chinese First Office Action for Chinese Application No. 200880124519.3 dated Jul. 15, 2011.

(56) References Cited

OTHER PUBLICATIONS

Cui, B.; Fabrication of Large Area Nanoprism Arrays and Their Application for Surface Enhanced Raman Spectroscopy, Nanotechnology, vol. 19, No. 14, p. 145302 (6 pages).
D Derkacs; Improved Performance of Amorphous Silicon Solar Cells Via Scattering From Surface Plasmon Polaritons in Nearby Metalic Nanoparticles, Appl.Phys.Lett, 89, 09310.
D Schaadt; Enhanced Semiconductor Optical Absorption Via Surface Plasmon Excitation in Metal Nanoparticles, Appl.Phys.Lett, 86,063106, 2005.
Stephen Y Chou, Peter R Krauss, Preston J Renstrom; Imprint Lithography With 25-Nanometer Resolution, Science Apr. 5, 1996, vol. 272, No. 5258, p. 85-87.
Dae-Geun Choi, Fluorinated organic-inorganic hybrid mold as a new stamp for nanoimprint and soft lithography, Langmuir, 21, p. 9390, 2005.
Dae-Guen Choi, Jun-Ho Jeong, Young-Suk Sim, Eung-Sug Lee, Woo-Soo Kim, Byeong-Soo Bae; Fluorinated Organic-Inorganic Hybrid Mold as a New Stamp for Nanoimprint and Soft Lithography, Langmuir 2005 9390-9392.
Ducker, R.E.; One-Step Photochemical Introduction of Nanopatterned Protein-Binding Functionalities to Oligo (Etylene Glycol)-Terminated Self-Assembled Monolayers, Journal of the American Chemical Society, Dec. 5, 2007, V 129, N 48, P14842+, USA.
First Office Action for Chinese Patent Application No. 200880124519.3 dated Jul. 15, 2011.
Guoyong Xie; The Fabrication of Subwavelength Anti-Reflective Nanostructures Using a Bio-Template, Nanotechnology 19(2008) 095605, p. 1-5.
Takeda, Y.; Surface Plasmon Resonance of Au Nanoparticles Fabricated by Negative Ion Implantation and Grid Structure Toward Plasmonic Applications, Optical Review, Jul.-Aug. 2006, vol. 13, No. 4, p. 231-4, Japan.
Hua Tan, Andrew Gilbertson, Stephen Y Chou; Roller Nanoimprint Lithography, J.Vac.Sci. Technol. B 1998 3926-3928.
Hua Tan, Roller nanoimprint lithography, Journal of Vacuum Science and technology, B 16(6), Nov.-Dec. 1998.
International Search Report and Written Opinion for PCT/US2008/012901 dated Feb. 6, 2009.
J Wang; Dewetting of Conducting Polymer Inkjet Droplets of Patterned Surface, Nature Materials, V.3, Mar. 2004, p. 171-176.
Tapio Makela, Novel imprinting tool for roll to roll manufacturing of submicron structures, TNT2005, Aug. 29-Sep. 2, 2005, Oviedo, Spain.
J.A. Maria A, S.Jeon A, J. Rogers; Nanopatterning With Comformable Phase Masks, Journal of Photochemistry and Photobiology A: Chemistry 166 (2004) 149-154.
U.S. Appl. No. 61/124,737, entitled "Fabrication of Nanophotonic Devices", to Boris Kobrin, filed Apr. 19, 2008.
Jing Zhao; Localized Surface Plasmon Resonance Viosensors, Nanomedicine 2006, 1(2), [219-228.
US Non-Final Office Action for U.S. Appl. No. 12/386,899 dated Sep. 12, 2011.
Joana Maria, Experimental and computational studies of phase shift lithography with binary elastimeric masks, Journal of Vacuum Science and technology, B 24(2), Mar.-Apr. 2006.
Kik, P.G.; Metal Nanoparticle Arrays for Near-Field Optical Lithography, Proceeding of the SPIE—the International Society for Optical Engineering, 2002, vol. 4810, p. 7-13, USA, Apr. 11, 2013.
Kik, P.G.; Plasmon Printing—A New Approach to Near-Field Lithography, Nanopatterning—From Ultralarge-Scale Integration to Biotechnology (Materials Research Society Symposium Proceedings vol. 705), 2002, p. 101-6, USA.
Kobrin, Boris; U.S. Appl. No. 60/011,861, filed Jan. 22, 2008.
L Creagh; Inkjet Printed Electronics: Moving to Production, Printed Electronics USA Nov. 13-14, 2007, San Francisco, CA.
Werayut Sriturav, Plasmonic Nanolithography, Nanoletters, VA,N6, p. 1085, 2004.
Lee, Hyesog; Sub-Diffraction-Limited Optical Imaging with Superlens and Hyperlens, University of California, Los Angeles, vol. 6809B of Dissertation Abstracts International, p. 6252 (118 pages), ISBN: 978-0-549-23309-1, 2007, USA.
Lin, H.; Localized Surface Plasmon Resonance of Metal Nanodot Nanowire Arrays Studied by Far-Field and Near-Field Optical, National Tsing Hua University, Hsinchu (Taiwan) Department of Materials Science and Engineering, Sep. 5, 2007, Taiwan.
McNab, S.J.; Effects of Mask Materials on Near Field Optical Nanolithography, Nanopatterning From Ultralarge-Scale Integration to Biotechnology (Materials Research Society Symposium Proceedings vol. 705), 2002, p. 107-12, USA.
Michael Berger; Moth Eyes Self-Cleaning Antireflection Nanotechnology Coatings, Nanowerk, 2008.
Xiangang Luo; Subwavelength Photolithography Based on Surface-Plasmon Polariton Resonance, Opt. Soc. America, Jul. 12, 2004, Optics Express, vol. 12, No. 14, USA.
Non-Final Office Action mailed Sep. 12, 2011: U.S. Appl. No. 12/386,899, filed Apr. 24, 2009, applicant Rolith.
Notice of Allowance dated Feb. 8, 2012 for U.S. Appl. No. 12/386,899.
Notice of Allowance dated Jan. 19, 2012 for U.S. Appl. No. 12/384,167.
Pan, Shanlin; Surface Plasmon Resonance Enhanced Photoluminescence and Applications in Organic Electronics, University of Rochester, vol. 6709B of Dissertations Abstracts International, p. 5095 (186 pages), ISBN: 978-0-542-84717-2, 2006, USA.
Paul Roach; Progress in Superhydrophobic Surface Development, Soft Matter, 2008, 4, p. 224-240.
PCT Search Report mailed date Feb. 6, 2009; PCT/US2008/012901, Filed on Nov. 18, 2008; Applicant Rolith.
Peter Forbes; Self-Cleaning Materials: Lotus Leaf-Inspired Nanotechnology, Scientific American, Jul. 30, 2008.
Xiangang Luo; Subwavelength Photolithography Based on Surface-Plasmon Polariton Resonance, Optical Society of America, Oct. 11, 2004, Optics Express, USA.
R. Kunz, Large area patterning of 50 nm structures on flexible substrates using near-field 193 nm radiation, Journal of Vacuum Science and technology, B 21(1), Jan.-Feb. 2003.
S Pillai; Surface Plasmon Enhanced Silicon Solar Cells, J.Appl. Phys, 101, 093105 (2007).
S Price; Addressable, Larege-Area Nanoscale Organix Light-Emitting Diodes, Small, 2007, 3, No. 3, p. 372-374.
Xiangang Luo; Suface Plasmon Resonant Interference Nanolithography Technique, Applied Physics Letter, Jun. 7, 2004, vol. 84, No. 23, p. 4780-2, USA.
Sefa-Ntiri, B.; Embedded Metal Mask Enhanced Evanescent Near Field Optical Lithograhy, Proceedings of the 32nd International Conference on Micro-and Nano-Engineering, May 10, 2007, United Kingdom, Apr. 11, 2013.
Sheridan, A.K.; Fabrication and Tuning of Nanoscale Metallic Ring and Split-Ring Arrays, Journal of Vacuum Science & Technology B (Microelectronics and Nanometer Structures), Nov. 2007, vol. 25, No. 6, p. 2628-31, USA.
Shvets, G.; Applications of Surface Plasmon and Phonon Polaritons to Developing Left-Handed Materials and Nano-Lithography, Proceeding of the SPIE the International Society for Optical Engineering, Nov. 3, 2003, vol. 5221, No. 1, p. 124-32, USA.
Mexican 3rd Office Action dated Apr. 30, 2013 , issued for Mexican Patent Application No. MX/a/2010/007954.
Chinese Notice of Reexamination for CN Application No. 200880124519.3, dated Jul. 29, 2014.

* cited by examiner

LARGE AREA NANOPATTERNING METHOD AND APPARATUS

PRIORITY CLAIM

This application is a divisional application of commonly assigned U.S. patent application Ser. No. 12/384,219, filed Apr. 1, 2009 and now U.S. Pat. No. 8,518,633, the entire disclosure of which is herein incorporated by reference. U.S. patent application Ser. No. 12/384,219 is a continuation of PCT Application No. PCT/US2008/012901 filed Nov. 18, 2008, the entire disclosures of which are herein incorporated by reference, PCT Application No. PCT/US2008/012901 claims the benefit of U.S. provisional Application No. 61/011,861, filed Jan. 22, 2008, the entire disclosures of which are herein incorporated by reference.

FIELD

Embodiments of the invention relate to nanopatterning methods which can be used to pattern large substrates or substrates such as films which may be sold as rolled goods. Other embodiments of the invention pertain to apparatus which may be used to pattern substrates, and which may be used to carry out method embodiments, including the kind described.

BACKGROUND

This section describes background subject matter related to the disclosed embodiments of the present invention. There is no intention, either express or implied, that the background art discussed in this section legally constitutes prior art.

Nanostructuring is necessary for many present applications and industries and for new technologies which are under development. Improvements in efficiency can be achieved for current applications in areas such as solar cells and LEDs, and in next generation data storage devices, for example and not by way of limitation.

Nanostructured substrates may be fabricated using techniques such as e-beam direct writing, Deep UV lithography, nanosphere lithography, nanoimprint lithography, near-filed phase shift lithography, and plasmonic lithography, for example.

NanoImprint Lithography (NIL) creates patterns by mechanical deformation of an imprint resist, followed by subsequent processing. The imprint resist is typically a monomeric or polymeric formulation that is cured by heat or by UV light during the imprinting. There are a number of variations of NIL. However, two of the processes appear to be the most important. These are Thermoplastic NanoImprint Lithography (TNIL) and Step and Flash NanoImprint Lithography (SFIL).

TNIL is the earliest and most mature nanoimprint lithography. In a standard TNIL process, a thin layer of imprint resist (a thermoplastic polymer) is spin coated onto a sample substrate. Then a mold, which has predefined topological patterns, is brought into contact with the sample, and pressed against the sample under a given pressure. When heated above the glass transition temperature of the thermoplastic polymer, the pattern on the mold is pressed into a thermoplastic polymer film melt. After the sample, with impressed mold is cooled down, the mold is separated from the sample and the imprint resist is left on the sample substrate surface. The pattern does not pass through the imprint resist; there is a residual thickness of unchanged thermoplastic polymer film remaining on the sample substrate surface. A pattern transfer process, such as reactive ion etching, can be used to transfer the pattern in the resist to the underlying substrate. The variation in the residual thickness of unaltered thermoplastic polymer film presents a problem with respect to uniformity and optimization of the etch process used to transfer the pattern to the substrate.

Tapio Makela et al. of VTT, a technical research center in Finland, have published information about a custom built laboratory scale roll-to-roll imprinting tool dedicated to manufacturing of submicron structures with high throughput. Hitachi and others have developed a sheet or roll-to-roll prototype NIL machine, and have demonstrated capability to process 15 meter long sheets. The goal has been to create a continuous imprint process using belt molding (nickel plated molds) to imprint polystyrene sheets for large geometry applications such as membranes for fuel cells, batteries and possibly displays.

Hua Tan et al of Princeton University have published 2 implementations of roller Nanoimprint lithography: rolling cylinder mold on flat, solid substrate, and putting a flat mold directly on a substrate and rolling a smooth roller on top of the mold. Both methods are based on TNIL approach, where roller temperature is set above the glass transition temperature, Tg, of the resist (PMMA), while the platform is set to temperature below Tg. Currently the prototype tools do not offer a desirable throughput. In addition, there is a need to improve reliability and repeatability with respect to the imprinted surface.

In the SFIL process, a UV curable liquid resist is applied to the sample substrate and the mold is made of a transparent substrate, such as fused silica After the mold and the sample substrate are pressed together, the resist is cured using UV light, and becomes solid. After separation of the mold from the cured resist material, a similar pattern to that used in TNIL may be used to transfer the pattern to the underlying sample substrate. Dae-Geun Choi from Korea Institute of Machinery suggested using fluorinated organic-inorganic hybrid mold as a stamp for Nanoimprint lithography, which does not require anti-stiction layer for demolding it from the substrate materials.

Since Nanoimprint lithography is based on mechanical deformation of resist, there are a number of challenges with both the SFIL and TNIL processes, in static, step-and-repeat, or roll-to-roll implementations. Those challenges include template lifetime, throughput rate, imprint layer tolerances, and critical dimension control during transfer of the pattern to the underlying substrate. The residual, non-imprinted layer which remains after the imprinting process requires an additional etch step prior to the main pattern transfer etch. Defects can be produced by incomplete filling of negative patterns and the shrinkage phenomenon which often occurs with respect to polymeric materials. Difference in thermal expansion coefficients between the mold and the substrate cause lateral strain, and the strain is concentrated at the corner of the pattern. The strain induces defects and causes fracture defects at the base part of the pattern mold releasing step.

Soft lithography is an alternative to Nanoimprint lithography method of micro and nano fabrication. This technology relates to replica molding of self-assembling monolayers. In soft lithography, an elastomeric stamp with patterned relief structures on its surface is used to generate patterns and structures with feature sizes ranging from 30 nm to 100 nm. The most promising soft lithography technique is micro-contact printing (μCP) with self-assembled monolayers (SAMS). The basic process of μCP includes: 1. A polydimethylsiloxane (PDMS) mold is dipped into a solution of a specific material, where the specific material is capable of forming a self-assembled monolayer (SAM). Such specific materials may be referred to as an ink. The specific material sticks to a protruding pattern on the PDMS master surface. 2. The PDMS mold, with the material-coated surface facing downward, is contacted with a surface of a metal-coated substrate such as gold or silver, so that only the pattern on the PDMS mold surface contacts the metal-coated substrate. 3. The specific material forms a chemical bond with the metal, so that only the specific material which is on the protruding pattern surface sill remain on the metal-coated surface after removal of the PDMS mold. The specific material forms a SAM on the metal-coated substrate which extends above the metal-coated surface approximately one to two nanometers (just like ink on a piece of paper). 4. The PDMS mold is removed from the metal-coated surface of the substrate, leaving the patterned SAM on the metal-coated surface.

The best-established specific materials for forming SAMs on gold or silver-coated surfaces are alkanethiolates. When the substrate surface contains hydroxyl-terminated moieties such as $Si/SiO_2$, $Al/Al_2O_3$, glass, mica, and plasma-treated polymers, alkylsiloxanes work well as the specific materials. With respect to the alkanethiolates, μCP of hexadecanethiol on evaporated thin (10-200 nm thick) films of gold or silver appears to be the most reproducible process. While these are the best-known materials for carrying out the pattern formation, gold and silver are not compatible with microelectronic devices based on silicon technology, although gold or silver-containing electrodes or conductive wires may be used. Currently, μCP for SAMS of siloxanes on $Si/SiO_2$ surfaces are not as tractable as the SAMS of alkanethiolates on gold or silver. The SAMS of siloxanes on $Si/SiO_2$ often provide disordered SAMs, and in some cases generate submonolayers or multilayers. Finally, the patterned molds available for μCP are flat "stamp" surfaces, and reproducible and reliable printing on large areas not only requires very accurate stitching of the printed pattern from the mold, but also requires constant wetting of the stamp with the SAM-forming specific material, which is quite problematic.

Optical Lithography does not use mechanical deformation or phase change of resist materials, like Nanoimprint lithography, and does not have materials management problems like Soft Lithography, thus providing better feature replication accuracy and more manufacturable processing. Though regular optical lithography is limited in resolution by diffraction effects some new optical lithography techniques based on near field evanescent effects have already demonstrated advantages in printing sub-100 nm structures, though on small areas only. Near-field phase shift lithography NFPSL involves exposure of a photoresist layer to ultraviolet (UV) light that passes through an elastomeric phase mask while the mask is in conformal contact with a photoresist. Bringing an elastomeric phase mask into contact with a thin layer of photoresist causes the photoresist to "wet" the surface of the contact surface of the mask. Passing UV light through the mask while it is in contact with the photoresist exposes the photoresist to the distribution of light intensity that develops at the surface of the mask. In the case of a mask with a depth of relief that is designed to modulate the phase of the transmitted light by π, a local null in the intensity appears at the step edge of relief. When a positive photoresist is used, exposure through such a mask, followed by development, yields a line of photoresist with a width equal to the characteristic width of the null in intensity. For 365 nm (Near UV) light in combination with a conventional photoresist, the width of the null in intensity is approximately 100 nm. A PDMS mask can be used to form a conformal, atomic scale contact with a flat, solid layer of photoresist. This contact is established spontaneously upon contact, without applied pressure. Generalized adhesion forces guide this process and provide a simple and convenient method of aligning the mask in angle and position in the direction normal to the photoresist surface, to establish perfect contact. There is no physical gap with respect to the photoresist. PDMS is transparent to UV light with wavelengths greater than 300 nm. Passing light from a mercury lamp (where the main spectral lines are at 355-365 nm) through the PDMS while it is in conformal contact with a layer of photoresist exposes the photoresist to the intensity distribution that forms at the mask.

Yasuhisa Inao, in a presentation entitled "Near-Field Lithography as a prototype nano-fabrication tool", at the 32nd International Conference on Micro and Nano Engineering in 2006, described a step-and-repeat near-field nanolithography developed by Canon, Inc. Near-field lithography (NFL) is used, where the distance between a mask and the photoresist to which a pattern is to be transferred are as close as possible. The initial distance between the mask and a wafer substrate was set at about 50 μm. The patterning technique was described as a "tri-layer resist process", using a very thin photoresist. A pattern transfer mask was attached to the bottom of a pressure vessel and pressurized to accomplish a "perfect physical contact" between the mask and a wafer surface. The mask was "deformed to fit to the wafer". The initial 50 μm distance between the mask and the wafer is said to allows movement of the mask to another position for exposure and patterning of areas more than 5 mm×5 mm. The patterning system made use of i-line (365 nm) radiation from a mercury lamp as a light source. A successful patterning of a 4 inch silicon wafer with structures smaller than 50 nm was accomplished by such a step-and-repeat method.

In an article entitled "Large-area patterning of 50 nm structures on flexible substrates using near-field 193 nm radiation", JVST B 21 (2002), at pages 78-81, Kunz et al. applied near-field phase shift mask lithography to the nano-patterning of flexible sheets (Polyimide films) using rigid fused silica masks and deep UV wavelength exposure. In a subsequent article entitled "Experimental and computational studies of phase shift lithography with binary elastomeric masks", JVST B 24(2) (2006) at pages 828-835, Maria et al. present experimental and computational studies of a phase shifting photolithographic technique that uses binary elastomeric phase masks in conformal contact with layers of photoresist. The work incorporates optimized masks formed by casting and curing prepolymers to the elastomer poly (dimethylsiloxane) against anisotropically etched structures of single crystal silicon on $SiO_2/Si$. The authors report on the capability of using the PDMS phase mask to form resist features in the overall geometry of the relief on the mask.

U.S. Pat. No. 6,753,131 to Rogers et al, issued Jun. 22, 2004, titled "Transparent Elastomeric, Contact-Mode Photolithography Mask, Sensor, and Wavefront Engineering Element", describes a contact-mode photolithography phase mask which includes a diffracting surface having a plurality of indentations and protrusions. The protrusions are brought into contact with a surface of a positive photoresist, and the surface is exposed o electromagnetic radiation through the phase mask. The phase shift due to radiation passing through indentations as opposed to the protrusions is essentially complete. Minima in intensity of electromagnetic radiation are thereby produced at boundaries between the indentations and protrusions. The elastomeric mask conforms well to the surface of the photoresist, and following development of the photoresist, features smaller than 100 nm can be obtained. (Abstract) In one embodiment, reflective plates are used exterior to the substrate and the contact mask, so radiation will be bounced to a desired location at a shifted phase. In another embodiment, the substrate may be shaped in a manner which causes a deformation of the phase shifting mask, affecting the behavior of the phase shifting mask during exposure.

Near Field Surface Plasmon Lithography (NFSPL) makes use of near-field excitation to induce photochemical or photophysical changes to produce nanostructures. The main near-field technique is based on the local field enhancement around metal nanostructures when illuminated at the surface plasmon resonance frequency. Plasmon printing consists of the use of plasmon guided evanescent waves through metallic nanostructures to produce photochemical and photophysical changes in a layer below the metallic structure. In particular, visible exposure ($\lambda$=410 nm) of silver nanoparticles in close proximity to a thin film of a g-line photoresist (AZ-1813 available from AZ-Electronic Materials, Micro-Chemicals GmbH, Ulm, Germany) can produce selectively exposed areas with a diameter smaller than $\lambda$/20. W. Srituravanich et al. in an article entitled "Plasmonic Nanolithography", Nanoletters V4, N6 (2004), pp. 1085-1088, describes the use of near UV light ($\lambda$=230 nm-350 nm) to excite SPs on a metal substrate, to enhance the transmission through subwavelength periodic apertures with effectively shorter wavelengths compared to the excitation light wavelength. A plasmonic mask designed for lithography in the UV range is composed of an aluminum layer perforated with 2 dimensional periodic hole arrays and two surrounding dielectric layers, one on each side. Aluminum is chosen since it can excite the SPs in the UV range. Quartz is employed as the mask support substrate, with a poly(methyl methacrylate) spacer layer which acts as adhesive for the aluminum foil and as a dielectric between the aluminum and the quartz. Poly(methyl methacrylate is used in combination with quartz, because their transparency to UV light at the exposure wavelength (i-line at 365 nm) and comparable dielectric constants (2.18 and 2.30, quartz and PMMA, respectively). A sub-100 nm dot array pattern on a 170 nm period has been successfully generated using an exposure radiation of 365 nm wavelength. Apparently the total area of patterning was about 5 $\mu$m$\times$5 $\mu$m, with no scalability issues discussed in the paper.

Joseph Martin has suggested a proximity masking device for Near-filed lithography in U.S. Pat. No. 5,928,815, where cylindrical block covered with metal film for light internal reflection is used for directing light to the one end of the cylinder (base of the cylinder), which contains a surface relief pattern used for Near-field exposure. This block is kept in some proximity distance ("very small, but not zero") from the photoresist on the sample. Cylinder is translated in horizontal direction using some precise mechanism, which is used to pattern photoresist area.

The only published idea about using rollers for optical lithography can be found in the Japanese Unexamined Patent Publication, No. 59200419A, published Nov. 13, 1984, titled "Large Area Exposure Apparatus". Toshio Aoki et al. described the use of a transparent cylindrical drum which can rotate and translate with an internal light source and a film of patterned photomask material attached on the outside of the cylindrical drum. A film of a transparent heat reflective material is present on the inside of the drum. A substrate with an aluminum film on its surface and a photoresist overlying the aluminum film is contacted with the patterned photomask on the drum surface and imaging light is passed through the photomask to image the photoresist on the surface of the aluminum film. The photoresist is subsequently developed, to provide a patterned photoresist. The patterned photoresist is then used as an etch mask for an aluminum film present on the substrate.

There is no description regarding the kinds of materials which were used as a photomask film or as a photoresist on the surface of the aluminum film. A high pressure mercury lamp light source (500 W) was used to image the photoresist overlying the aluminum film. Glass substrates about 210 mm (8.3 in.)$\times$150 mm (5.9 in.) and about 0.2 mm (0.008 in.) thick were produced using the cylindrical drum pattern transfer apparatus. The feature size of the pattern transferred using the technique was about 500 $\mu$m$^2$, which was apparently a square having a dimension of about 22.2 $\mu$m$\times$22.2 $\mu$m. This feature size was based on the approximate pixel size of an LCD display at the time the patent application was filed in 1984. The photomask film on the outside of the cylindrical drum was said to last for approximately 140,000 pattern transfers. The contact lithography scheme used by Toshio Aoki et al. is not capable of producing sub-micron features.

It does not appear that an nanoimprinting methods (thermal or UV-cured) or soft lithography using printing with SAM materials are highly manufacturable processes. In general, the imprinting method creates deformation of the substrate material due to the thermal treatment (thermal NIL, for example) or shrinkage of pattern features upon polymer curing (UV-cured polymeric features). Moreover, due to the application of pressure (hard contact) between a stamp and a substrate, defects are essentially unavoidable, and a stamp has a very limited lifetime. Soft lithography does have an advantage in that it is thermal and stress-free printing technology. However, the use of a SAM as an "ink" for a sub-100 nm pattern is very problematic due to the drifting of molecules over the surface, and application over large areas has not been proved experimentally.

SUMMARY

Embodiments of the invention pertain to methods and apparatus useful in the nanopatterning of large area substrates ranging from about 200 mm$^2$ to about 1,000,000 mm$^2$, by way of example and not by way of limitation. In some instances the substrate may be a film, which has a given width and an undefined length, which is sold on a roll. The nanopatterning technique makes use of Near-Field UV photolithography, where the mask used to pattern the substrate is in contact or in very close proximity (in the evanescent field, less than 100 nm) from the substrate. The Near-Field photolithography may include a phase-shifting mask or surface plasmon technology.

One embodiment the exposure apparatus which includes a phase-shifting mask in the form of a UV-transparent rotatable mask having specific phase shifting relief on its outer surface. In another embodiment of the phase-shifting mask technology, the transparent rotatable mask, which is typically a cylinder, may have a polymeric film which is the phase-shifting mask, and the mask is attached to the cylinder's outer surface. When it is difficult to obtain good and uniform contact with the substrate surface, especially for large processing areas, it is advantageous to have the polymeric film be a conformal, elastomeric polymeric film such as PMDS, which makes excellent conformal contact with the substrate through Van-der Waals forces. The polymeric film phase-shifting mask may consist of multiple layers. Where the outer layer is nanopatterned to more precisely represent prescribed feature dimensions in a radiation-sensitive (photosensitive) layer.

Another embodiment of the exposure apparatus employs a soft elastomeric photomask material, such as a PDMS film, having non-transparent features fabricated on one of its surfaces, which is attached to the outer surface of the cylinder. Such feature may be chrome features produced on the PDMS film using one of the lithographic techniques known in the art.

In an embodiment of the exposure apparatus which includes surface plasmon technology, a metal layer or film is laminated or deposited onto the outer surface of the rotatable mask, which is typically a transparent cylinder. The metal layer or film has a specific series of through nano-holes. In another embodiment of the surface plasmon technology, a layer of metal nanoparticles is deposited on the transparent rotatable mask's outer surface, to achieve the surface plasmons enhanced nanopatterning. A radiation source is provided interior to the transparent cylinder. For example, and not by way of limitation, a UV lamp may be installed interior of the cylinder. In the alternative, the radiation source may be placed outside the cylinder, with light from the radiation source being piped to the interior of the cylinder through one or both ends of the cylinder. The radiation may be directed from outside the cylinder or within the cylinder toward particular areas within the interior of the cylinder using an optical system including mirrors, lenses, or combinations thereof, for example. Radiation present within the cylinder may be directed toward the mask substrate contact area using an optical grating. The radiation may be directed toward the mask substrate area (coupled) through a waveguide with a grating. The waveguide or grating is typically placed inside the cylinder, to redirect radiation toward the contact areas between the cylinder outer surface and the substrate surface to be imaged.

In a specialized embodiment of a light source of radiation, an OLED flexible display may be attached around the exterior of the rotatable mask, to emit light from each of the pixels toward the substrate. In this instance the rotatable mask does not need to be transparent. In addition, the particular pattern to be transferred to a radiation-sensitive material on the substrate surface may be generated depending on the application, through control of the light emitted from the OLED. The pattern to be transferred may be changed "on the fly" without the need to shut down the manufacturing line.

To provide high throughput of pattern transfer to a radiation-sensitive material, and increase the quantity of nanopatterned surface area, it is helpful to move the substrate or the rotatable mask, such as a cylinder, against each other. The cylinder is rotated on the substrate surface when the substrate is static or the substrate is moved toward the cylinder while the cylinder is static. For reasons discussed below, there are advantages to moving the substrate toward the cylinder.

It is important to be able to control the amount of force which occurs at the contact line between the cylinder and the radiation-sensitive material on the surface of the substrate (for example the contact line between an elastomeric nanopatterned film present on the surface of the cylinder and a photoresist on the substrate surface). To control this contact line, the cylinder may be supported by a tensioning device, such as, for example, springs which compensate for the cylinder's weight. The substrate or cylinder (or both) are moved (upward and downward) toward each other, so that a spacing between the surfaces is reduced, until contact is made between the cylinder surface and the radiation-sensitive material (the elastomeric nanopatterned film and the photoresist on the substrate surface, for example). The elastomeric nanopatterned film will create a bond with a photoresist via Van-der Walls forces. The substrate position is then moved back (downward) to a position at which the springs are elongated, but the elastomeric nanopatterned film remains in contact with the photoresist. The substrate may then be moved toward the cylinder, forcing the cylinder to rotate, maintaining a dynamic contact between the elastomeric nanopatterned film and the photoresist on the substrate surface. alternatively, the cylinder can be rotated and the substrate can be moved independently, but in synchronous motion, which will assure slip-free contact during dynamic exposure.

Multiple cylinders may be combined into one system and arranged to expose the radiation-sensitive surface of the substrate in a sequential mode, to provide double, triple, and multiple patterning of the substrate surface. This exposure technique can be used to provide higher resolution. The relative positions of the cylinders may be controlled by interferometer and an appropriate computerized control system.

In another embodiment, the exposure dose may affect the lithography, so that an edge lithography (where narrow features can be formed, which corresponds to a shift of phase in a PDMS mask, for example) can be changed to a conventional lithography, and the feature size in an imaged photoresist can be controlled by exposure doze. Such control of the exposure dose is possible by controlling the radiation source power or the rotational speed of the cylinder (exposure time). The feature size produced in the photoresist may also be controlled by changing the wavelength of the exposure radiation, light source, for example.

The masks on the cylinders may be oriented by an angle to the direction of substrate movement. This enables pattern formation in different directions against the substrate. Two or more cylinders can be placed in sequence to enable 2D patterns.

In another embodiment, the transparent cylindrical chamber need not be rigid, but may be formed from a flexible material which may be pressurized with an optically transparent gas. The mask may be the cylinder wall or may be a conformal material present on the surface of the cylinder wall. This permits the cylinder to be rolled upon a substrate which is not flat, while making conformal contact with the substrate surface.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

In FIG. 2, the substrate is a film 208 upon which a pattern is imaged by radiation which passes through surface relief 212 on a first (transparent) cylinder 206 while film 208 travels from roll 211 to roll 213. A second cylinder 215 is provided on the backside 209 of film 208 to control the contact between the film 208 and the first cylinder 206.

In FIG. 3, the substrate is a film 308 which travels from roll 311 to roll 313. A first transparent cylinder 306 with surface relief 312 is used to pattern the topside 310 of film 308, while a second transparent cylinder 326 with surface relief 332 is used to pattern the bottom side 309 of film 308.

In FIG. 4B, the polymer base material 415 may be either the same polymeric material or may be a different polymeric material from the patterned surface material 413.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within .+−.10%.

Embodiments of the invention relate to methods and apparatus useful in the nanopatterning of large area substrates, where a rotatable mask is used to image a radiation-sensitive material. Typically the rotatable mask comprises a cylinder. The nanopatterning technique makes use of near-field photolithography, where the wavelength of radiation used to image a radiation-sensitive layer on a substrate is 650 nm or less, and where the mask used to pattern the substrate is in contact with the substrate. The near-field photolithography may make use of a phase-shifting mask, or nanoparticles on the surface of a transparent rotating cylinder, or may employ surface plasmon technology, where a metal layer on the rotating cylinder surface comprises nano holes. The detailed description provided below is just a sampling of the possibilities which will be recognized by one skilled in the art upon reading the disclosure herein.

Figure 1A:
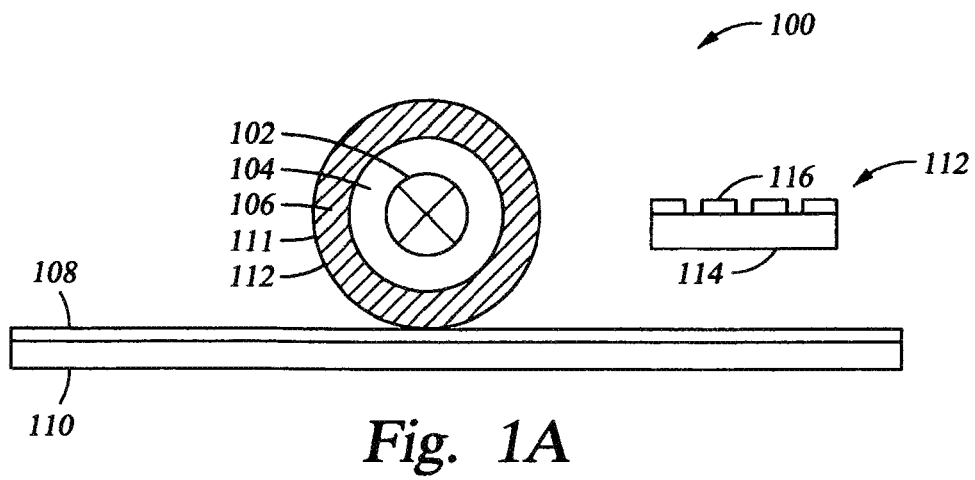
FIG. 1A shows a cross-sectional view of one embodiment of an apparatus 100 useful in patterning of large areas of substrate material, where a radiation transparent cylinder 106 has a hollow interior 104 in which a radiation source 102 resides. In this embodiment, the exterior surface 111 of the cylinder 106 is patterned with a specific surface relief 112. The cylinder 106 rolls over a radiation sensitive material 108 which overlies a substrate 110.
Figure 1B:
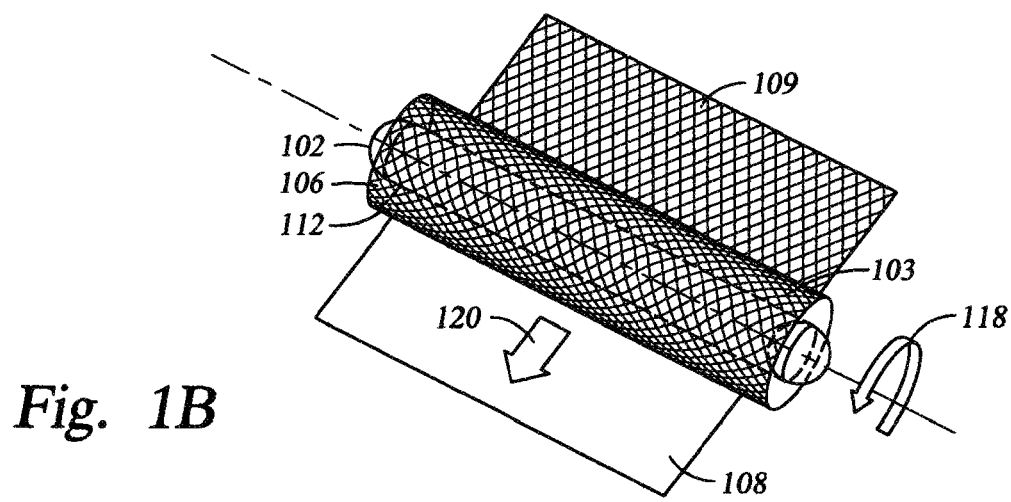
FIG. 1B shows a top view of the apparatus and substrate illustrated in FIG. 1A, where the radiation sensitive material 108 has been imaged 109 by radiation (not shown) passing through surface relief 112.

Although the rotating mask used to generate a nanopattern within a layer of radiation-sensitive material may be of any configuration which is beneficial, and a number of these are described below, a hollow cylinder is particularly advantageous in terms of imaged substrate manufacturability at minimal maintenance costs. FIG. 1A shows a cross-sectional view of one embodiment of an apparatus 100 useful in patterning of large areas of substrate material, where a radiation transparent cylinder 106 has a hollow interior 104 in which a radiation source 102 resides. In this embodiment, the exterior surface 111 of the cylinder 106 is patterned with a specific surface relief 112. The cylinder 106 rolls over a radiation sensitive material 108 which overlies a substrate 110. FIG. 1B shows a top view of the apparatus and substrate illustrated in FIG. 1A, where the radiation sensitive material 108 has been imaged 109 by radiation (not shown) passing through surface relief 112. The cylinder is rotating in the direction shown by arrow 118, and radiation from a radiation source 102 passes through the nanopattern 112 present on the exterior surface 103 of rotating cylinder 106 to image the radiation-sensitive layer (not shown) on substrate 108, providing an imaged pattern 109 within the radiation-sensitive layer. The radiation-sensitive layer is subsequently developed to provide a nanostructure on the surface of substrate 108. In FIG. 1B, the rotatable cylinder 106 and the substrate 120 are shown to be independently driven relative to each other. In another embodiment, the substrate 120 may be kept in dynamic contact with a rotatable cylinder 106 and moved in a direction toward or away from a contact surface of the rotatable cylinder 106 to provide motion to an otherwise static rotatable cylinder 106. In yet another embodiment, the rotatable cylinder 106 may be rotated on a substrate 120 while the substrate is static.

The specific surface relief 112 may be etched into the exterior surface of the transparent rotating cylinder 106. In the alternative, the specific surface relief 112 may be present on a film of polymeric material which is adhered to the exterior surface of rotating cylinder 106. The film of polymeric material may be produced by deposition of a polymeric material onto a mold (master). The master, created on a silicon substrate, for example, is typically generated using an e-beam direct writing of a pattern into a photoresist present on the silicon substrate. Subsequently the pattern is etched into the silicon substrate. The pattern on the silicon master mold is then replicated into the polymeric material deposited on the surface of the mold. The polymeric material is preferably a conformal material, which exhibits sufficient rigidity to wear well when used as a contact mask against a substrate, but which also can make excellent contact with the radiation-sensitive material on the substrate surface. One example of the conformal materials generally used as a transfer masking material is PDMS, which can be cast upon the master mold surface, cured with UV radiation, and peeled from the mold to produce excellent replication of the mold surface.

Figure 2:
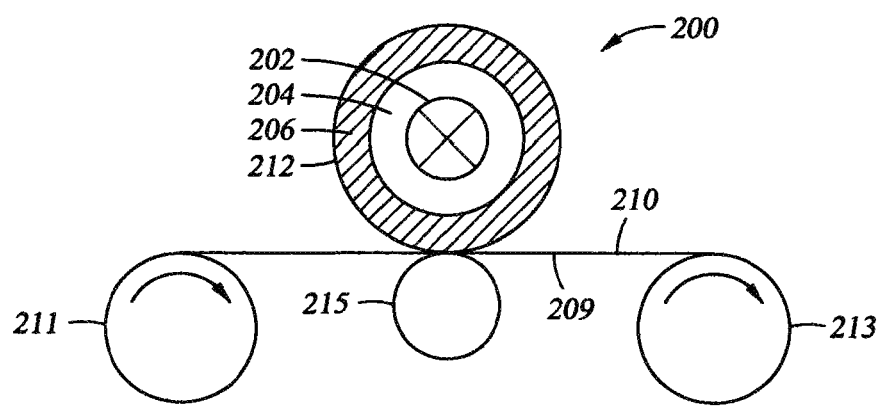
FIG. 2 shows a cross-sectional view of another embodiment of an apparatus 200 useful in patterning of large areas of substrate material.
Figure 3:
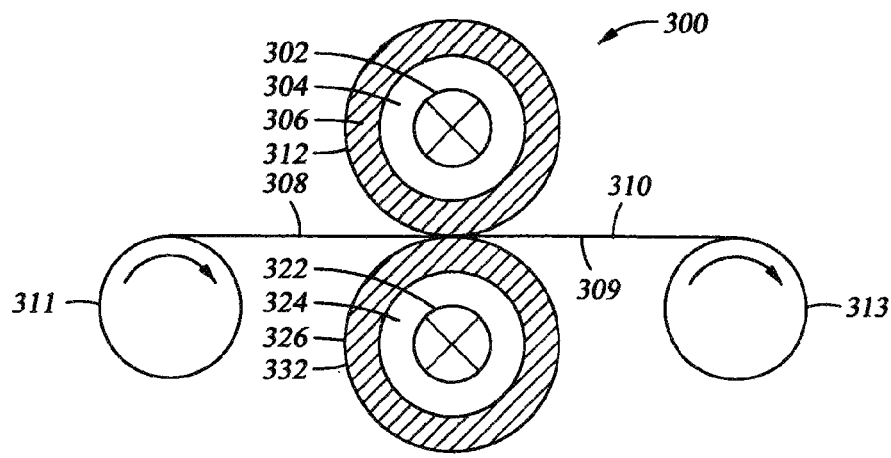
FIG. 3 shows a cross-sectional view of another embodiment of an apparatus 300 useful in patterning large areas of substrate material.

FIG. 2 shows a cross-sectional view 200 of another embodiment of an apparatus 200 useful in patterning of large areas of substrate material. In FIG. 2, the substrate is a film 208 upon which a pattern is imaged by radiation which passes through surface relief 212 on a first (transparent) cylinder 206 while film 208 travels from roll 211 to roll 213. A second cylinder 215 is provided on the backside 209 of film 208 to control the contact between the film 208 and the first cylinder 206. The radiation source 202 which is present in the hollow space 204 within transparent cylinder 206 may be a mercury vapor lamp or another radiation source which provides a radiation wavelength of 365 nm or less. The surface relief 212 may be a phase-shift mask, for example, where the mask includes a diffracting surface having a plurality of indentations and protrusions, as discussed above in the Background Art. The protrusions are brought into contact with a surface of a positive photoresist (a radiation-sensitive material), and the surface is exposed to electromagnetic radiation through the phase mask. The phase shift due to radiation passing through indentations as opposed to the protrusions is essentially complete. Minima in intensity of electromagnetic radiation are thereby produced at boundaries between the indentations and protrusions. An elastomeric phase mask conforms well to the surface of the photoresist, and following development of the photoresist, features smaller than 100 nm can be obtained FIG. 3 shows a cross-sectional view 300 of another embodiment of an apparatus 300 useful in patterning large areas of substrate material. The substrate is a film 308 which travels from roll 311 to roll 313. There is a layer of radiation-sensitive material (not shown) on both the topside 310 of film 308 and the bottom side 309 of film 308. There is a first transparent cylinder 306, with a hollow center 304, which includes a radiation source 302, having surface relief 312, which is used to pattern the top side 310 of film 308. There is a second transparent cylinder 326, with a hollow center 324, which includes a radiation source 322, having surface relief 332, which is used to pattern the bottom side 209 of film 308.

Figure 4A:
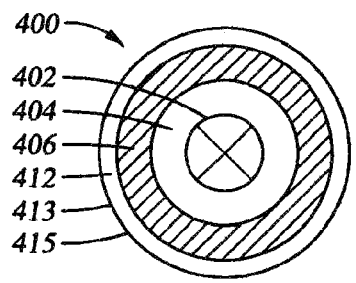
FIG. 4A shows a cross-sectional view of an embodiment 400 of a transparent cylinder 406 which includes a hollow center area 404 with an internal source of radiation 402. The surface relief area 412 is a conformal structure which includes polymer film 415 with a patterned surface 413 which is particularly useful for near-field lithography.

FIG. 4A shows a cross-sectional view 400 of an embodiment of a transparent cylinder 406 which includes a hollow center area 404 with an internal source of radiation 402. The surface relief 412 is a conformal structure which includes polymer film 415 with a patterned surface 413 which is particularly useful for near-field lithography. The polymeric material of patterned surface 413 needs to be sufficiently rigid that the pattern will contact a substrate surface to be imaged in the proper location. At the same time, the polymeric material must conform to the surface of a radiation-sensitive material (not shown) which is to be imaged.

Figure 4B:
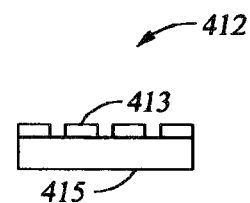
FIG. 4B shows an enlargement of surface 413, which is a surface relief polymer structure 413 on top of polymeric base material 415.

FIG. 4B shows an enlargement of surface 413, which is a surface relief polymer structure 413 on top of polymeric base material 415. In FIG. 4B, the polymer base material 415 may be either the same polymeric material or may be a different polymeric material from the patterned surface material 413. A transparent conformal material such as a silicone or PDMS, for example, may be used as polymer film 415, in combination with a more rigid transparent overlying layer of material, such as PDMS with a different ratio of mixing components, or polymethyl methacrylate PMMA, for example. This provides a patterned surface 413, which helps avoid distortion of features upon contact with a location on the radiation-sensitive surface of a substrate (not shown), while the polymeric base material simultaneously provides conformance with the substrate surface in general.

Figure 5A:
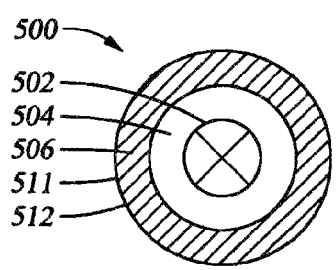
FIG. 5A shows a cross sectional view of an alternative embodiment 500 of surface relief 512 which is present on a hollow transparent cylinder 506.
Figure 5B:
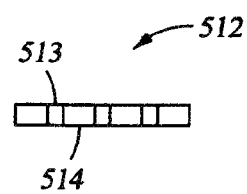
FIG. 5B shows an enlargement of the surface relief 512, which is a thin metal layer 514 which is patterned with a series of nanoholes 513, where the metal layer is applied over the exterior surface 511 of hollow transparent cylinder 506.
Figure 5C:
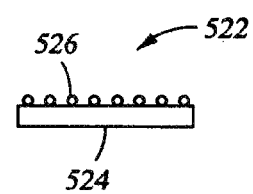
FIG. 5C shows an alternative surface relief 522 which may be used on the surface of transparent cylinder 506. Surface relief 522 is formed by metal particles 526 which may be applied directly upon the exterior surface 511 of hollow transparent cylinder 506 or may be applied on a transparent film 524 which is attached to the exterior surface 511 of hollow transparent cylinder 506.

FIG. 5A shows a cross sectional view 500 of a transparent cylinder 506, with hollow central area 504 including a radiation source 502, where the surface 511 presents an alternative embodiment of surface relief 512. FIG. 5B shows an enlargement of the surface relief 512, which is a thin metal layer 514 which is patterned with a series of nanoholes 513, where the metal layer is present on the exterior surface 511 of hollow transparent cylinder 506. The metal layer may be a patterned layer adhered to the exterior surface of transparent cylinder 506. In the alternative, a metal layer may be deposited on the surface of the transparent cylinder by evaporation or sputtering or another technique known in the art and then may subsequently etched or ablated with a laser to provide a patterned metal exterior surface 511. FIG. 5C shows an alternative surface relief 522 which may be used on the surface of transparent cylinder 506. Surface relief 522 is formed by metal particles 526 which are applied on an exterior surface 511 of hollow transparent cylinder 506, or on a transparent film 524 which is attached to the exterior surface 511 of hollow transparent cylinder 506.

Figure 6A:
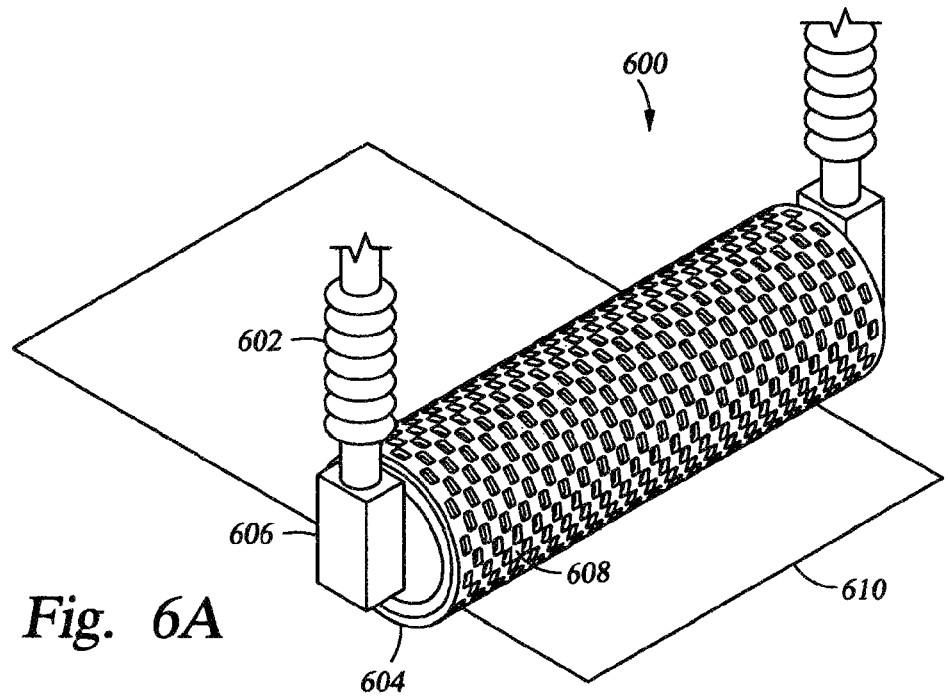
FIG. 6A is a schematic three dimensional illustration 600 of a transparent cylinder 604 having a patterned surface 608, where the cylinder 604 is suspended above a substrate 610 using a tensioning device 602 illustrated as springs.

FIG. 6A is a schematic three dimensional illustration 600 of a transparent cylinder 604 having a patterned surface 608. A radiation source (not shown) is present within the interior of transparent cylinder 604. The transparent cylinder 604 is suspended above a substrate 610 using a tensioning device 602, which is shown as springs in illustration 600. One of skill in the art of mechanical engineering will be familiar with a number of tensioning devices which may be used to obtain the proper amount of contact between the outer surface 608 of transparent cylinder 604 and the surface of substrate 610. In one embodiment method of using the apparatus shown in FIG. 6A, the apparatus is used to image a radiation-sensitive material (not shown) on a substrate 610, where substrate 610 is a polymeric film, which may be supplied and retrieved on a roll to roll system of the kind shown in FIG. 2. The transparent cylinder 604 is lowered toward the polymeric film substrate (or the polymeric film substrate is raised), until contact is made with the radiation-sensitive material. The polymeric film, which is typically elastomeric will create a Van-der-Walls force bond with the radiation-sensitive material. The transparent cylinder 604 may then be raised (or the polymeric film substrate lowered) to a position where contact remains between the surface 608 of transparent cylinder 604 and the surface of the radiation-sensitive material, but the tension between the two surfaces is such that the force placed on the surface 608 is minimal. This enables the use of very fine nanopatterned features on the surface 608 of transparent cylinder 604. When the substrate 610 begins to move, the transparent cylinder 604 will also move, forcing transparent cylinder 604 to rotate, maintaining the dynamic contact between the radiation-sensitive material and the underlying polymeric film substrate 610. At any moment of the dynamic exposure, the contact between the cylinder and a photosensitive layer is limited to one narrow line. Due to strong Van-der Walls forces between an elastomeric film, for example, on the cylinder exterior surface and the radiation sensitive (photo sensitive) layer on the substrate, contact is maintained uniform throughout the entire process, and along the entire width of the mask (length) on the cylinder surface. In instances where an elastomeric material is not present on the cylinder surface which contacts the substrate, an actuating (rotating) cylinder using a stepper-motor synchronized with the translational movement of the substrate may be used. This provides a slip-free exposure process for polymeric or other cylinder surface material which does not provide strong adhesion forces relative to the substrate.

Figure 6B:
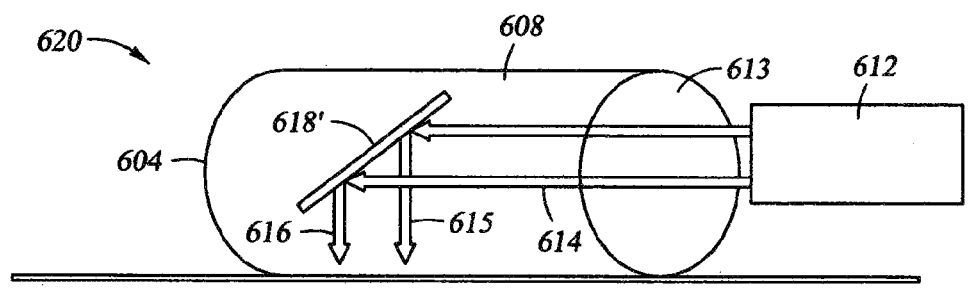
FIG. 6B is a schematic of an embodiment 620 where the radiation used to accomplish imaging is supplied from a radiation source 612 exterior to cylinder 604, with the radiation distributed internally 615 and 616 within the hollow portion of the cylinder 604.

FIG. 6B is a schematic of an embodiment 620 where the radiation used to accomplish imaging is supplied from a radiation source 612 exterior to cylinder 604, with the radiation distributed internally 615 and 616 within the hollow portion of the cylinder 604. The radiation may be directed through the transparent cylinder 604 through the patterned mask surface 608 toward the radiation-sensitive surface (not shown) of substrate 608 using various lenses, mirrors, and combinations thereof.

Figure 6C:
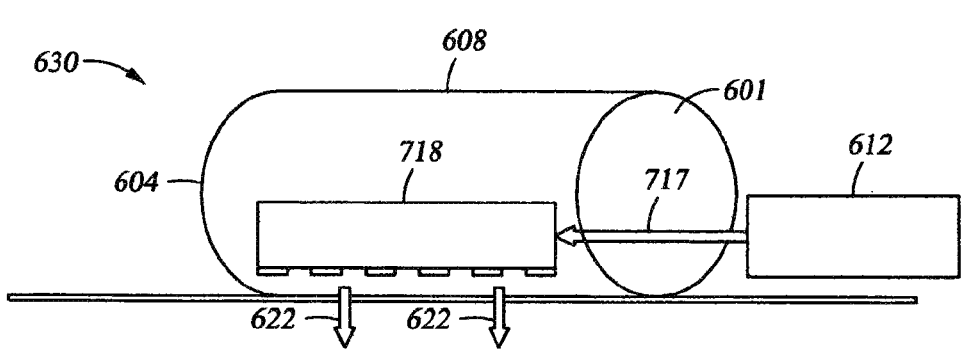
FIG. 6C is a schematic of an embodiment 630 where the radiation used to accomplish imaging is supplied from the exterior radiation source 612 is focused 617 into a waveguide 618 and distributed from the waveguide 618 to an optical grating 621 present on the interior surface 601 of the cylinder 604.

FIG. 6C is a schematic of an embodiment 630 where the radiation used to accomplish imaging of the radiation-sensitive material is supplied from a location which is exterior to the transparent cylinder 604. The exterior radiation source 612 is focused 617 into a waveguide 618 and distributed from the waveguide 618 to an optical grating 620 present on the interior surface 601 of the cylinder 604.

Figure 6D:
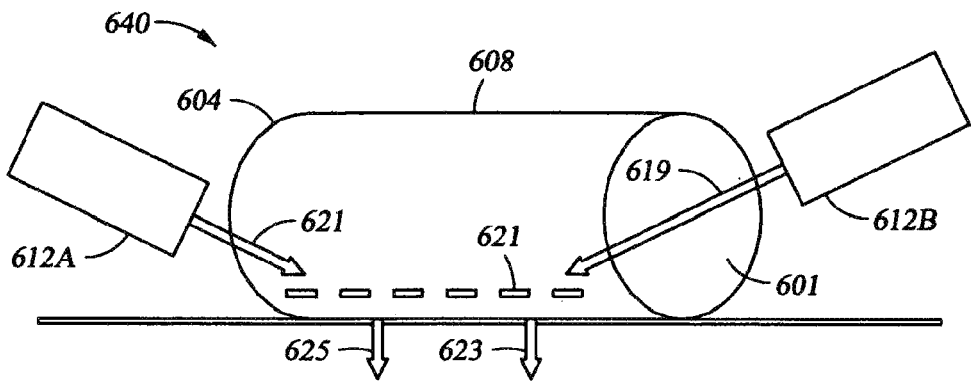
FIG. 6D is a schematic of an embodiment 640 where the radiation used to accomplish imaging is supplied from two exterior radiation sources 612A and 612B, and is focused 621 and 619, respectively upon an optical grating 621 present on the interior surface 601 of cylinder 604.

FIG. 6D is a schematic of an embodiment 640 where the radiation used to accomplish imaging is supplied from two exterior radiation sources 612A and 612B, and is focused 621 and 619, respectively, upon an optical grating 620 present on the interior surface 601 of cylinder 604.

Figure 7A:
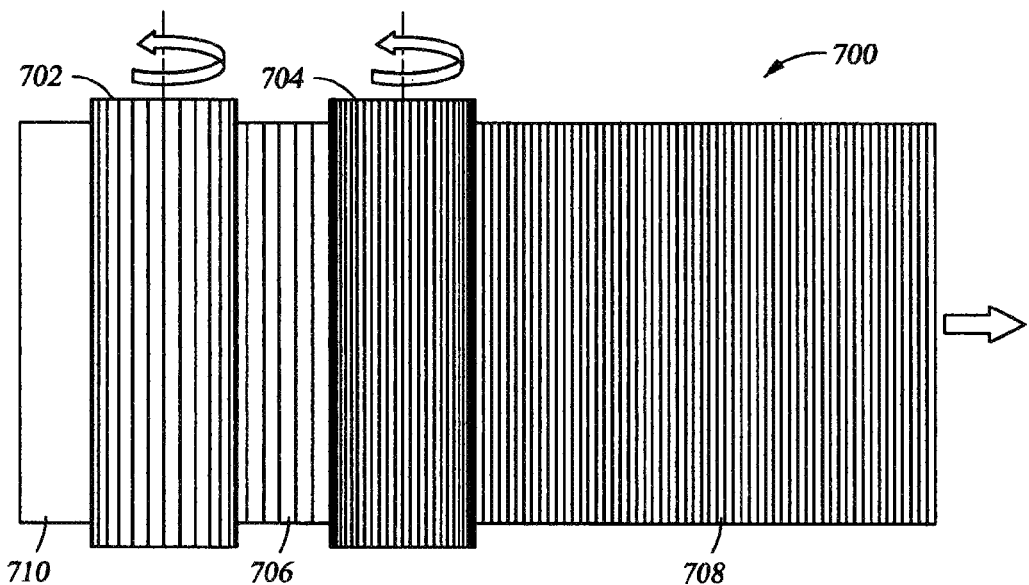
FIG. 7A is a schematic showing the use of multiple cylinders, such as two cylinders 702 and 704, for example, in series to provide multiple patterning, which may be used to obtain higher resolution, for example.

FIG. 7A is a schematic 700 showing the use of multiple cylinders, such as two cylinders 702 and 704, for example, in series to provide multiple patterning, which may be used to obtain higher resolution, for example. The relative positions of the cylinders 702 and 704, for example may be controlled using data from an interferometer (not shown) in combination with a computerized control system (not shown).

Figure 7B:
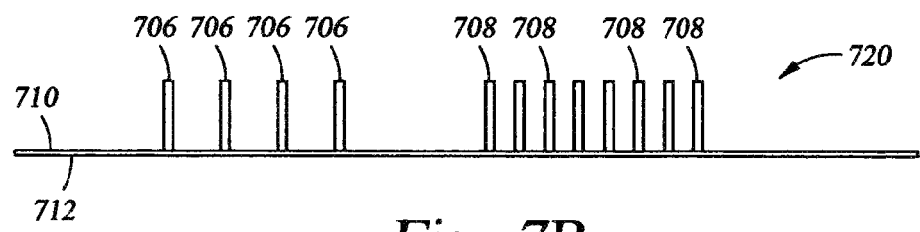
FIG. 7B is a cross-sectional schematic showing a pattern 706 created by a first cylinder 702 after imaging and development of a radiation-sensitive material 710. The altered pattern 708 is after imaging and development of the radiation-sensitive material 710 where the altered pattern 708 is created by use of the first cylinder 702 in combination with a second cylinder 704.

FIG. 7B is a cross-sectional schematic 720 showing a pattern 706 created by a first cylinder 702 after imaging and development of a radiation-sensitive material 710. The altered pattern 708 is after imaging and development of the radiation-sensitive material 710 where the altered pattern 708 is created by use of the first cylinder 702 in combination with a second cylinder 704.

Figure 8:
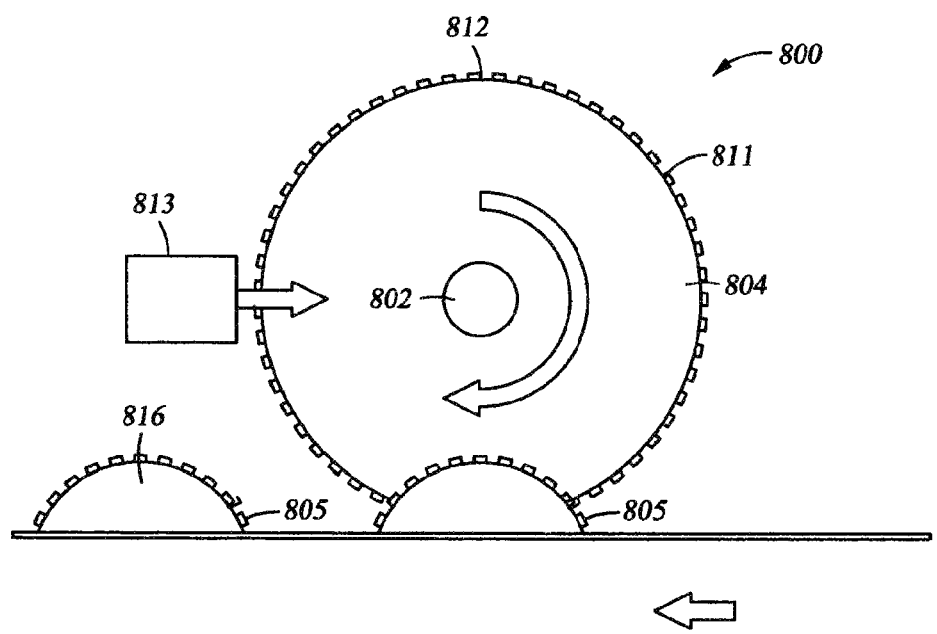
FIG. 8 shows a cross-sectional schematic of a deformable cylinder 800, the interior 804 of which is pressurized using an apparatus 813 which supplies an optically transparent gas. The outer surface 811 of deformable cylinder 800 may be a nanopatterned/nanostructured film 802 of a conformable material, which can be rolled upon a non-flat substrate 805 so that radiation from radiation source 902 can be precisely applied over a surface 816 of substrate 805.

FIG. 8 shows a cross-sectional schematic of a deformable cylinder 800, the interior 804 of which is pressurized using an apparatus 813 which supplies an optically transparent gas, such as nitrogen, for example. The outer surface 811 of deformable cylinder 800 may be a nanopatterned/nanostructured film 812 of a conformable material, which can be rolled upon a non-flat substrate 805 so that radiation from radiation source 802 can be precisely applied over a surface 816 of substrate 805.

In another embodiment, a liquid having a refractive index of greater than one may be used between the cylinder surface and a radiation sensitive (photo sensitive, for example) material present on the substrate surface. Water may be used, for example. This enhances the pattern feature's contrast in the photosensitive layer.

While the invention has been described in detail for a variety of embodiments above, various modifications within the scope and spirit of the invention will be apparent to those of working skill in this technological field. Accordingly, the scope of the invention should be measured by the appended claim

I claim:

1. An apparatus to carry out near-field lithography, comprising:
    a) a rotatable mask having a nanopattern on an exterior surface of said mask, wherein said nanopattern is formed from a conformable material; and
    b) a radiation source which supplies radiation of a wavelength of 436 nm or less from said nanopattern, while said nanopattern is in contact with a radiation-sensitive layer of material, wherein said rotatable mask is a cylinder, wherein said rotatable mask is transparent, and wherein said rotatable mask is a phase-shifting mask.

2. An apparatus in accordance with claim 1, wherein a rotatable mask is suspended over said substrate by a tensioning device which can be adjusted to control the amount of force applied to a surface in contact with said rotatable mask.

3. An apparatus to carry out near-field lithography, comprising:
    a) a rotatable mask having a nanopattern on an exterior surface of said mask, wherein said nanopattern is formed from a conformable material; and
    b) a radiation source which supplies radiation of a wavelength of 436 nm or less from said nanopattern, while said nanopattern is in contact with a radiation-sensitive layer of material, wherein said rotatable mask includes a rigid cylinder, wherein the conformable material is a transparent film on an outer surface of the rigid cylinder, and wherein said rotatable mask further includes a metal layer on the transparent film, wherein said rotatable mask is configured to employ radiation generated using surface plasmon techniques to produce photochemical or photophysical changes in a layer below the metal layer.

4. An apparatus in accordance with claim 3, wherein the metal layer includes nanoholes.

5. An apparatus in accordance with claim 4, wherein multiple rotatable masks are present in an arrangement so that said multiple rotatable masks pass over a substrate in sequence.

6. An apparatus in accordance with claim 4, wherein multiple rotatable masks are present, and wherein a rotatable mask is present on both the top side and bottom side of a substrate which is imaged by said apparatus.

7. An apparatus in accordance with claim 6, wherein at least one rotatable mask which transmits imaging radiation is present on both the top side and the bottom side of a substrate which is imaged by said apparatus.

8. An apparatus to carry out near-field lithography, comprising:
  a) a rotatable mask having a nanopattern on an exterior surface of said mask, wherein said nanopattern is formed from a conformable material, wherein either said deformable cylinder is transparent, and wherein said rotatable mask is a phase-shifting mask, or said rotatable mask employs radiation generated using surface plasmon techniques; and
  b) a radiation source which supplies radiation of a wavelength of 436 nm or less from said nanopattern, while said nanopattern is in contact with a radiation-sensitive layer of material, wherein said rotatable mask includes a deformable cylinder formed from a flexible material, wherein said deformable cylinder is pressurized with an optically transparent gas.

* * * * *